(12) United States Patent
Park

(10) Patent No.: US 9,398,687 B2
(45) Date of Patent: Jul. 19, 2016

(54) DISPLAY DEVICE INCLUDING LINE ON GLASS

(71) Applicant: LG DISPLAY CO., LTD., Seoul (KR)

(72) Inventor: Sun-Kyu Park, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 362 days.

(21) Appl. No.: 13/942,185

(22) Filed: Jul. 15, 2013

(65) Prior Publication Data

US 2014/0139508 A1 May 22, 2014

(30) Foreign Application Priority Data

Nov. 16, 2012 (KR) .................. 10-2012-0130155

(51) Int. Cl.
*G09G 5/00* (2006.01)
*H05K 1/02* (2006.01)
*G06F 3/00* (2006.01)

(52) U.S. Cl.
CPC ............ *H05K 1/0289* (2013.01); *G06F 3/00* (2013.01); *H05K 2201/09681* (2013.01); *H05K 2201/10106* (2013.01); *H05K 2201/10136* (2013.01)

(58) Field of Classification Search
CPC .......................... G02F 1/13452; G02F 1/1345

USPC .................. 345/98, 212; 349/37; 361/803
See application file for complete search history.

(56) References Cited

U.S. PATENT DOCUMENTS

2008/0278428 A1* 11/2008 Song .................... G09G 3/3696
345/98
2011/0128485 A1* 6/2011 Kim ....................... G02F 1/1345
349/122

* cited by examiner

*Primary Examiner* — Calvin C Ma
(74) *Attorney, Agent, or Firm* — Birch, Stewart, Kolasch & Birch, LLP

(57) ABSTRACT

A display device according to an embodiment of the invention includes a first PCB including first PCB lines to transmit powers and second PCB lines to transmit an image data, gate control signals and data control signals; a second PCB including third PCB lines to transmit the powers and fourth PCB lines to transmit the image data, the gate control signals and the data control signals; a first COF including first COF lines connected to the first PCB lines and second COF lines connected to the second PCB lines; a second COF including third COF lines connected to the third PCB lines and fourth COF lines connected to the fourth PCB lines; and a display panel including first LOGs connected to the first COF lines and the third COF lines and second LOGs connected to the second COF lines and the fourth COF lines.

19 Claims, 3 Drawing Sheets

DISPLAY DEVICE INCLUDING LINE ON GLASS

This application claims priority to and the benefit of Korean Patent Application No. 10-2012-0130155 filed in the Republic of Korea on Nov. 16, 2012, which is hereby incorporated by reference in its entirety.

BACKGROUND OF THE INVENTION

1. Field of the Invention

Embodiments of the invention relate to a display device, and more particularly, to a display device including a line on glass (LOG) for transmitting a power and a signal between printed circuit boards.

2. Discussion of the Related Art

Among various display devices, flat panel displays (FPDs) such as a liquid crystal display (LCD) device, a plasma display panel (PDP) and an organic light emitting diode (OLED) display device have been widely used. In general, a display device includes a display panel displaying an image, a driving circuit unit supplying a power and a signal to the display panel and a frame surrounding and integrating the display panel and the driving circuit unit. The driving circuit unit is connected to the display panel and supplies a plurality of powers and a plurality of signals to the display panel.

The driving circuit unit may include a printed circuit board (PCB) where a timing controlling part and a power part are mounted and a flexible film where a data driving part is mounted. The driving circuit unit will be illustrated hereinafter.

FIG. 1 is a view showing a display device according to the related art.

In FIG. 1, a display device 10 according to the related art includes a display panel 20, first to third printed circuit boards (PCBs) 40, 42 and 44, first and second flexible films 50 and 52, and a plurality of chip on films (COFs) 60.

A connector 40a, a timing controlling part 30 and a power part 32 are formed on the first PCB 40. The timing controlling part 30 and the power part 32 may be formed as an integrated circuit (IC).

When an external power, an image signal and a plurality of timing signals are inputted through the connector 40a from an external system, the power part 32 generates and outputs a power for the display device 10, and the timing controlling part 30 generates and outputs an image data and a plurality of control signals using the image signal and the plurality of timing signals.

In addition, first and second PCB lines 70 and 78 are formed on the first PCB 40. The first PCB line 70 transmits the power outputted from the power part 32, and the second PCB line 78 transmits the image data and the plurality of control signals outputted from the timing controlling part 30.

First film lines 72a and 72b and second film lines 80a and 80b are formed on each of the first and second flexible films 50 and 52. The first film lines 72a and 72b transmit the power of the first PCB 40 to the second and third PCBs 42 and 44, and the second film lines 80a and 80b transmit the image data and the plurality of control signals of the first PCB 40 to the second and third PCBs 42 and 44.

Third PCB lines 74a and 74b and fourth PCB lines 82a and 82b are formed on each of the second and third PCBs 42 and 44. The third PCB lines 74a and 74b transmit the power from the first and second flexible films 50 and 52 to the plurality of COFs 60, and the fourth PCB lines 82a and 82b transmit the image data and the plurality of control signals from the first and second flexible films 50 and 52 to the plurality of COFs 60.

A data driving part 34 is formed on each of the plurality of COFs 60. The data driving part 34 may be formed as an IC. The data driving part 34 generates and outputs a data signal using the image data and the plurality of control signals transmitted from the second and third PCBs 42 and 44.

In addition, first and second COF lines 76 and 84 are formed on each of the plurality of COFs 60. The first COF lines 76 transmit the power from the second and third PCBs 42 and 44 to the data driving part 34, and the second COF lines 84 transmit the image data and the plurality of control signals from the second and third PCBs 42 and 44 to the data driving part 34.

The display panel 20 displays the image using the data signal outputted from the data driving part 34.

The image data, the plurality of control signals and the power of the timing controlling part 30 and the power part 32 are transmitted to the data driving part 34, and the data signal of the data driving part 34 is transmitted to the display panel 20, thereby the image is displayed. In the display device 10 having a large size over 29 inch or 30 inch, a plurality of pads of the first PCB 40 having a large size corresponding to the display panel 20 having a large size are not directly aligned with a plurality of pads of the plurality of COFs 60 because of a difference in coefficients of thermal expansion between the first PCB 40 and the plurality of COFs 60.

In the display device 10 having a large size, as a result, the second and third PCBs 42 and 44 are connected to the plurality of COFs 60 that is connected to the display panel 20, and the first PCB 40 is connected to the second and third PCBs 42 and 44 using the first and second flexible films 50 and 52 so that the image data, the plurality of control signals and the power of the timing controlling part 30 and the power part 32 can be transmitted to the data driving part 34.

However, since the number of the PCBs increases and the number of the flexible films such as a flexible printed circuit (FPC) and a flexible flat cable (FFC) increases, structure and fabrication process become complicated and fabrication cost increases. In addition, fabrication time increases due to increase of a connection process, and deterioration in the connection process increases.

SUMMARY OF THE INVENTION

Accordingly, embodiments of the present invention are directed to a display device that substantially obviates one or more of the problems due to limitations and disadvantages of the related art.

An object of the an embodiment of the present invention is to provide a display device including a line on glass (LOG) where structure and fabrication process are simplified by transmitting a signal and a power of a printed circuit board (PCB) to another PCB through the LOG.

Another object of an embodiment of the present invention is to provide a display device including a LOG where deterioration is prevented or reduced without increase in fabrication cost by transmitting a signal and a power between a printed circuit board (PCB) and the LOG of a display panel through a chip on film (COF) line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the embodiments of the present invention, as embodied and broadly described herein, there is provided a display device including: a first printed circuit board (PCB) including a plurality of first PCB lines and a plurality of second PCB lines, the plurality of first PCB lines configured to transmit a plurality of powers, and the plurality of second PCB lines configured to transmit an image data, a plurality of gate control signals and a plurality of data control signals; a second PCB including a plurality of third PCB lines and a plurality of fourth PCB lines, the plurality of third PCB lines configured to transmit the plurality of powers, and the plurality of fourth PCB lines configured to transmit the image data, the plurality of gate control signals and the plurality of data control signals; a first chip on film (COF) including a plurality of first COF lines and a plurality of second COF lines, the plurality of first COF lines connected to the plurality of first PCB lines, and the plurality of second COF lines connected to the plurality of second PCB lines; a second COF including a plurality of third COF lines and a plurality of fourth COF lines, the plurality of third COF lines connected to the plurality of third PCB lines, and the plurality of fourth COF lines connected to the plurality of fourth PCB lines; and a display panel including a plurality of first lines on glass (LOGs) and a plurality of second LOGs, the plurality of first LOGs connected to the plurality of first COF lines and the plurality of third COF lines, and the plurality of second LOGs connected to the plurality of second COF lines and the plurality of fourth COF lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the present invention and together with the description serve to explain the principles of the invention. In the drawings.

DETAILED DESCRIPTION OF THE EMBODIMENTS

Reference will now be made in detail to the embodiments, examples of which are illustrated in the accompanying drawings.

Figure 1:
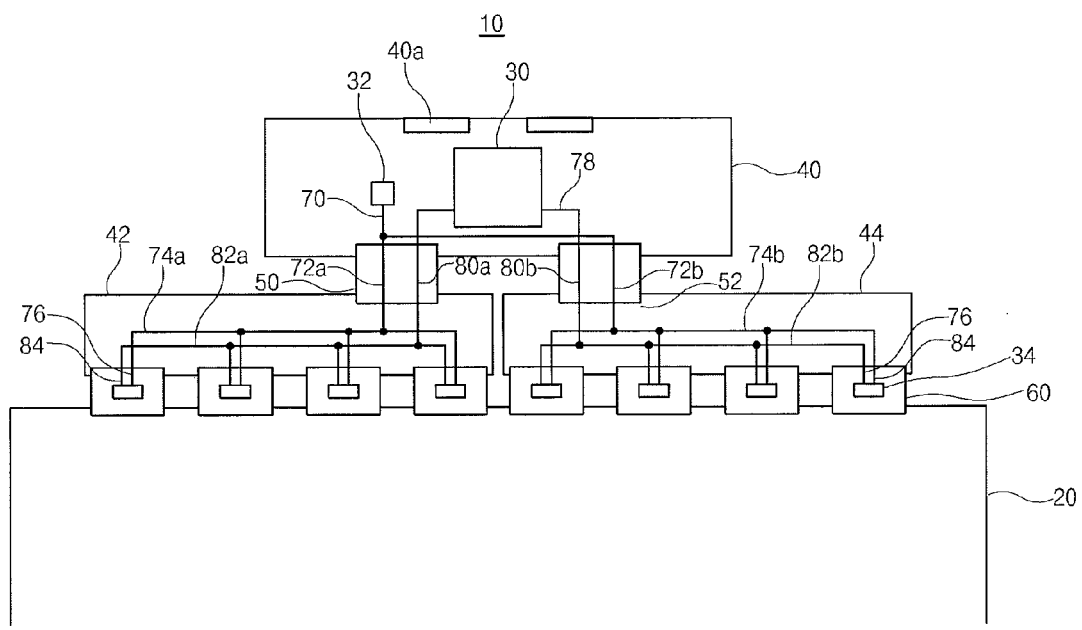
FIG. 1 is a view showing a display device according to the related art.
Figure 2:
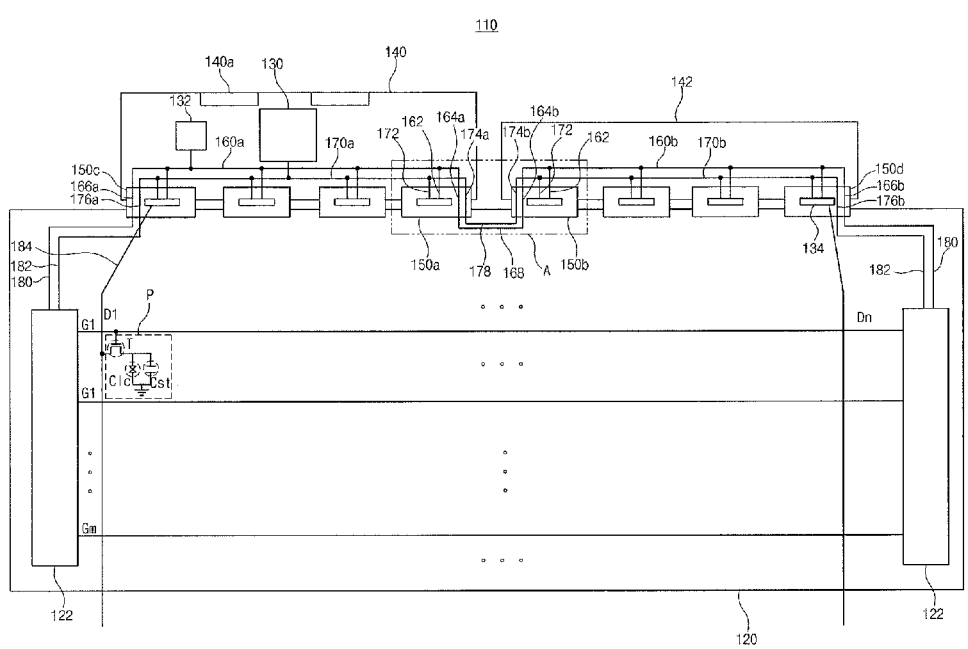
FIG. 2 is a view showing a liquid crystal display device according to an embodiment of the present invention.
Figure 3:
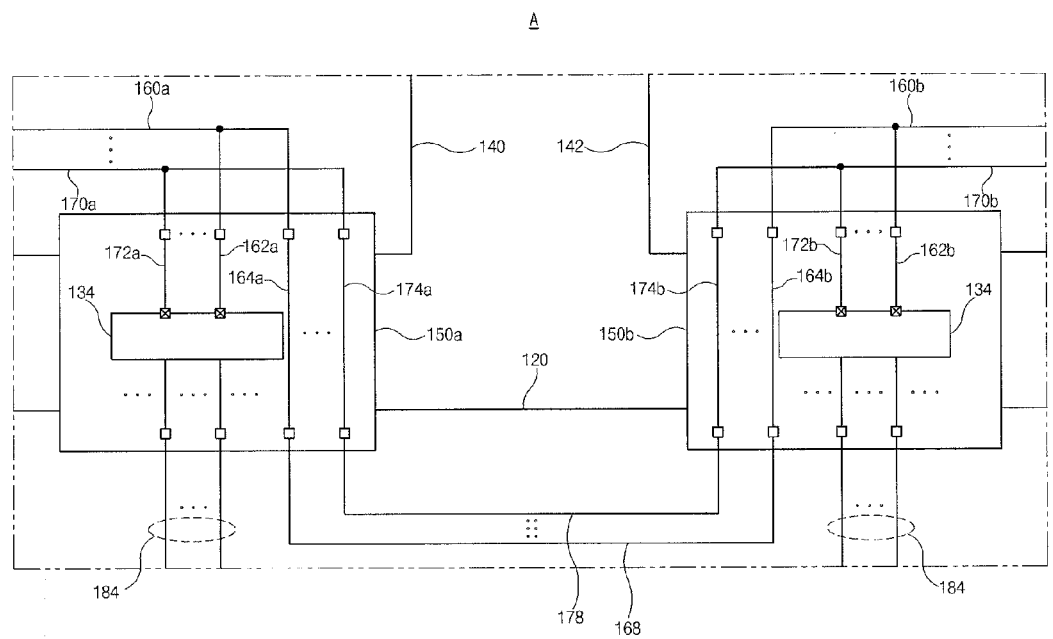
FIG. 3 is a magnified view of a region A of FIG. 2 according to an embodiment of the present invention.

FIG. 2 is a view showing a liquid crystal display device according to an embodiment of the present invention, and FIG. 3 is a magnified view of a region A of FIG. 2 according to an embodiment of the present invention.

In FIGS. 2 and 3, a liquid crystal display (LCD) device 110 according to an embodiment of the present invention includes a display panel 120 displaying an image using a gate signal and a data signal, first and second printed circuit boards (PCBs) 140 and 142 disposed side by side along one side of the display panel 120, a plurality of chip on films (COFs) 150a, 150b, 150c and 150d connected between the display panel 120 and the first and second PCBs 140 and 142.

The display panel 120 includes first and second substrates facing each other and spaced apart from each other and a liquid crystal layer between the first and second substrates. In the display area on an inner surface of the first substrate of the display panel 120, the display panel 120 includes a display area displaying the image and a non-display area surrounding the display area. First to $m^{th}$ gate lines G1 to Gm, first to $n^{th}$ data lines D1 to Dn crossing the first to $m^{th}$ gate lines G1 to Gm to define a pixel region P, a thin film transistor (TFT) T connected to the gate line and the data line in the pixel region P, and a pixel electrode connected to the TFT T are formed.

The TFT T includes a gate electrode on the inner surface of the first substrate, a gate insulating layer on the gate electrode, a semiconductor layer on the gate insulating layer over the gate electrode, and source and drain electrodes spaced apart from each other on the semiconductor layer. In addition, a passivation layer is formed on the TFT T, and the pixel electrode connected to the drain electrode of the TFT T is formed in the pixel region P on the passivation layer.

The pixel electrode over the inner surface of the first substrate, a common electrode over an inner surface of the second substrate and the liquid crystal layer between the pixel electrode and the common electrode constitute a liquid crystal capacitor Clc, and the pixel electrode functions as one electrode of a storage capacitor Cst.

The TFT T transmits the data signal supplied through the data lines D1 to Dn to the pixel electrode according to the gate signal supplied through the gate lines G1 to Gm, and transmittance of the liquid crystal layer of the liquid crystal capacitor Clc is changed so that a grey level can be displayed.

In the non-display area on the inner surface of the first substrate of the display panel 120, a gate driving part 122, a plurality of first lines on glass (LOGs) 168, a plurality of second LOGs 178, a plurality of third LOGs 180, a plurality of fourth LOGs 182 and a plurality of fifth LOGs 184 are formed.

Although one first LOG 168, one second LOG 178, one third LOG 180, one fourth LOG 182 and one fifth LOG 184 are shown in FIG. 2, each of the first to fifth LOGs 168, 178, 180, 182 and 184 may include a plurality of conductive lines parallel to each other.

The gate driving part 122 may include a shift register having a plurality of switching elements of the same structure as the TFT T of the pixel region P, and the gate driving part 122 may be formed at both sides or at one side of the display panel 120. In addition, the plurality of first LOGs 168, the plurality of second LOGs 178, the plurality of third LOGs 180, the plurality of fourth LOGs 182 and the plurality of fifth LOGs 184 may include the same layer and the same material as one of the gate electrode, the source electrode and the drain electrode of the TFT T and the pixel electrode, and the first to fifth LOGs 168, 178, 180, 182 and 184 may transmit a plurality of powers or a plurality of signals.

A connector 140a, a timing controlling part (or a timing controller) 130 and a power part 132 are formed on the first PCB 140, and the timing controlling part 130 and the power part 132 may be formed as an integrated circuit (IC).

When an external power, an image signal and a plurality of timing signals are inputted through the connector 140a from an external system such as a graphic card or a television system, the power part 132 may generate and output a power for the display device 110, and the timing controlling part 130 may generate and output an image data, a plurality of gate control signals and a plurality of data control signals using the image signal and the plurality of timing signals.

For example, the plurality of powers may include a source voltage VDD, a ground voltage VSS, a common voltage VCOM, a gate high voltage VGH and a gate low voltage VGL. In addition, the plurality of timing signals may include a data enable signal DE, a horizontal synchronization signal HSY, a vertical synchronization signal VSY and a clock signal CLK, the plurality of gate control signals may include a gate start pulse signal GSP, a gate shift clock signal GSC and a gate output enable signal GOE, and the plurality of data control signals may include a source start pulse signal SSP, a source sampling clock signal SSC, a source output enable signal SOE, a polarity signal POL, a gamma reference signal GAMMA and an embedded panel interface signal EPI.

Further, a plurality of first PCB lines 160a and a plurality of second PCB lines 170a are formed on the first PCB 140. The plurality of first PCB lines 160a may transmit the power outputted from the power part 132, and the plurality of second PCB lines 170a may transmit the image data, the plurality of gate control signals and the plurality of data control signals outputted from the timing controlling part 130.

A plurality of third PCB lines 160b and a plurality of fourth PCB lines 170b are formed on the second PCB 142. The plurality of third PCB lines 160b may transmit the plurality of powers outputted from the power part 132 and transmitted through the plurality of COFs 150a, 150b, 150c and 150d and the plurality of first LOGs 168, and the plurality of fourth PCB lines 170b may transmit the image data, the plurality of gate control signals and the plurality of data control signals outputted from the timing controlling part 130 and transmitted through the plurality of COFs 150a, 150b, 150c and 150d and the plurality of second LOGs 178. In embodiments of the invention, the first PCB 140 may include the power part 132 that provides the power, and the second PCB 142 includes the timing controller part 130 that provides the control signals.

Although one first PCB line 160a, one second PCB line 170a, one third PCB line 160b and one fourth PCB line 170b are shown in FIG. 2, each of the first to fourth PCB lines 160a, 170a, 160b and 170b may include a plurality of conductive lines parallel to each other.

A plurality of first COF lines 164a, a plurality of second COF lines 174a, a plurality of third COF lines 164b and a plurality of fourth COF lines 174b are formed on at least two of the plurality of COFs 150a, 150b, 150c and 150d. For example, the first to fourth COF lines 164a, 174a, 164b and 174b may be formed on the first and second COFs 150a and 150b corresponding to the first and second PCBs 140 and 142, respectively. As a result, the plurality of first COF lines 164a and the plurality of second COF lines 174a may be formed on the first COF 150a corresponding to one end of the first PCB 140 adjacent to the second PCB 142, and the plurality of third COF lines 164b and the plurality of fourth COF lines 174b may be formed on the second COF 150b corresponding to one end of the second PCB 142 adjacent to the first PCB 140.

Although one first COF line 164a, one second COF line 174a, one third COF line 164b and one fourth COF line 174b are shown in FIG. 2, each of the first to fourth COF lines 164a, 174a, 164b and 174b may include a plurality of conductive lines parallel to each other.

The plurality of first COF lines 164a are connected between the plurality of first PCB lines 160a of the first PCB 140 and the plurality of first LOGs 168 of the display panel 120 and may transmit the plurality of powers of the plurality of first PCB lines 160a to the plurality of first LOGs 168. The plurality of second COF lines 174a are connected between the plurality of second PCB lines 170a of the first PCB 140 and the plurality of second LOGs 178 of the display panel 120 and may transmit the image data and the plurality of data control signals of the plurality of second PCB lines 170a to the plurality of second LOGs 178.

Further, the plurality of third COF lines 164b are connected between the plurality of first LOGs 168 of the display panel 120 and the plurality of third PCB lines 160b of the second PCB 142 and may transmit the plurality of powers of the plurality of first LOGs 168 to the plurality of third PCB lines 160b. The plurality of fourth COF lines 174b are connected between the plurality of second LOGs 178 of the display panel 120 and the plurality of fourth PCB lines 170b of the second PCB 142 and may transmit the image data and the plurality of data control signals of the plurality of second LOGs 178 to the plurality of fourth PCB lines 170b.

Since the plurality of powers, the image data and the plurality of data control signals of the first PCB 140 are transmitted to the second PCB 142 using the plurality of first COF lines 164a and the plurality of second COF lines 174a of the first COF 150a, the plurality of first LOGs 168 and the plurality of second LOGs 178 of the display panel 120 and the plurality of third COF lines 164b and the plurality of fourth COF lines 174b of the second COF 150b, an additional flexible film such as a flexible printed circuit (FPC) or a flexible flat cable (FFC) can be omitted. As a result, structure and fabrication process are simplified and fabrication cost is reduced.

In addition, a dummy line or an added line of each COF can be used as the plurality of first COF lines 164a and the plurality of second COF lines 174a of the first COF 150a and the plurality of third COF lines 164b and the plurality of fourth COF lines 174b of the second COF 150b without a change in a width of each COF, and the plurality of first LOGs 168 and the plurality of second LOGs 178 of the display panel 120 can be formed of one of the gate electrode, the source electrode and the drain electrode of the TFT T and the pixel electrode. As a result, deterioration in a connection thereof is prevented or reduced without an increase in fabrication cost.

A data driving part 134 is formed on each of the plurality of COFs 150a, 150b, 150c and 150d. The data driving part 134 may be formed as an IC. In addition, the data driving part 134 may generate and output a data signal using the image data and the plurality of control signals transmitted from the first and second PCBs 142 and 144.

A plurality of fifth COF lines 162 (162a, 162b) and a plurality of sixth COF lines 172 (172a, 172b) are formed on each of the plurality of COFs 150a, 150b, 150c and 150d. The plurality of fifth COF lines 162 may transmit the plurality of powers transmitted from the first and second PCBs 140 and 142 to the data driving part 134, and the plurality of sixth COF lines 172 may transmit the image data and the plurality data control signals transmitted from the first and second PCBs 142 and 144 to the data driving part 134. In addition, the data driving part 134 may generate and output the data signal using the image data and the plurality of data control signals.

Although one fifth COF line 162 and one sixth COF line 172 are shown in FIG. 2, each of fifth and sixth COF lines 162 and 172 may include a plurality of conductive lines parallel to each other.

Since the data driving part 134 is connected to the plurality of fifth LOGs 184 of the display panel 120 and the plurality of fifth LOGs 184 are connected to the first to $n^{th}$ data lines D1 to Dn, the data signal outputted from the data driving part 134 is inputted to the first to $n^{th}$ data lines D1 to Dn through the plurality of fifth LOGs 184.

A plurality of seventh COF lines 166a, a plurality of eighth COF lines 176a, a plurality of ninth COF lines 166b and a plurality of tenth COF lines 176b are formed on at least one of the plurality of COFs 150a, 150b, 150c and 150d. For example, the seventh to tenth COF lines 166a, 176a, 166b and 176b may be formed on the third and fourth COFs 150c and 150d corresponding to the first and second PCBs 140 and 142, respectively. As a result, the plurality of seventh COF lines 166a and the plurality of eighth COF lines 176a may be formed on the third COF 150c corresponding to the other end of the first PCB 140, and the plurality of ninth COF lines 166b and the plurality of tenth COF lines 176b may be formed on the fourth COF 150d corresponding to the other end of the second PCB 142.

Although one seventh COF line 166a, one eighth COF line 176a, one ninth COF line 166b and one tenth COF line 176b are shown in FIG. 2, each of the seventh to tenth COF lines 166a, 176a, 166b and 176b may include a plurality of conductive lines parallel to each other.

The plurality of seventh COF lines 166a are connected between the plurality of first PCB lines 160a of the first PCB 140 and the plurality of third LOGs 180 of the display panel 120 and may transmit the plurality of powers of the plurality of first PCB lines 160a to the plurality of third LOGs 180. The plurality of eighth COF lines 176a are connected between the plurality of second PCB lines 170a of the first PCB 140 and the plurality of fourth LOGs 182 of the display panel 120 and may transmit the image data and the plurality of gate control signals of the plurality of second PCB lines 170a to the plurality of fourth LOGs 182.

Further, the plurality of ninth COF lines 166b are connected between the plurality of third PCB lines 160b of the second PCB 142 and the plurality of third LOGs 180 of the display panel 120 and may transmit the plurality of powers of the plurality of third PCB lines 160b to the plurality of third LOGs 180. The plurality of tenth COF lines 176b are connected between the plurality of fourth PCB lines 170b of the second PCB 142 and the plurality of fourth LOGs 182 of the display panel 120 and may transmit the plurality of gate control signals of the plurality of fourth PCB lines 170b to the plurality of fourth LOGs 182.

The plurality of powers of the plurality of third LOGs 180 and the plurality of gate control signals of the plurality of fourth LOGs 182 are transmitted to the gate driving part 122 at each side of the display panel 120. The gate driving part 122 may generate and output the gate signal using the plurality of gate control signals, and the gate signal outputted from the gate driving part 122 may be inputted to the first to $m^{th}$ gate lines G1 to Gm. Although the gate driving part 122 is formed at both sides of the display panel 120, the gate driving part 122 may be formed at one side of the display panel 120 in another embodiment.

Although the LCD device 110 is illustrated in FIGS. 2 and 3, the plurality of COF lines and the plurality of LOGs transmitting the plurality of powers and the plurality of control signals between two PCBs may be applied to an organic light emitting diode (OLED) display device or a plasma display panel (PDP).

Consequently, since a power and a signal of one printed circuit board (PCB) is transmitted to another PCB using a line on glass (LOG) of a display panel, structure and fabrication process are simplified and fabrication cost is reduced. In addition, a power and a signal are transmitted between a PCB and a LOG of a display panel using a chip on film (COF) line, deterioration in connection is prevented without increase in fabrication cost.

It will be apparent to those skilled in the art that various modifications and variations can be made in a display device of the embodiments of the present invention without departing from the sprit or scope of the invention. Thus, it is intended that the embodiments of the present invention covers the modifications and variations of this invention provided they come within the scope of the appended claims and their equivalents.

What is claimed is:

1. A display device, comprising:
    a first printed circuit board (PCB) including a plurality of first PCB lines and a plurality of second PCB lines, the plurality of first PCB lines configured to transmit a plurality of powers, and the plurality of second PCB lines configured to transmit an image data, a plurality of gate control signals and a plurality of data control signals;
    a second PCB including a plurality of third PCB lines and a plurality of fourth PCB lines, the plurality of third PCB lines configured to transmit the plurality of powers, and the plurality of fourth PCB lines configured to transmit the image data, the plurality of gate control signals and the plurality of data control signals;
    a first chip on film (COF) including a plurality of first COF lines and a plurality of second COF lines, the plurality of first COF lines connected to the plurality of first PCB lines, and the plurality of second COF lines connected to the plurality of second PCB lines;
    a second COF including a plurality of third COF lines and a plurality of fourth COF lines, the plurality of third COF lines connected to the plurality of third PCB lines, and the plurality of fourth COF lines connected to the plurality of fourth PCB lines; and
    a display panel including a plurality of first lines on glass (LOGs) and a plurality of second LOGs, the plurality of first LOGs connected to the plurality of first COF lines and the plurality of third COF lines, and the plurality of second LOGs connected to the plurality of second COF lines and the plurality of fourth COF lines,
    wherein the display panel includes a display area for displaying an image and a non-display area surrounding the display area,
    wherein a gate line and a data line cross each other to define a pixel region, a thin film transistor connected to the gate line and the data line and a pixel electrode connected to the thin film transistor are formed in the display area, and
    wherein the plurality of first LOGs and the plurality of second LOGs include a same layer and a same material as one of a gate electrode, a source electrode and a drain electrode of the thin film transistor and the pixel electrode.

2. The display device according to claim 1, wherein the plurality of powers is transmitted from the first PCB to the second PCB through the plurality of first PCB lines, the plurality of first COF lines, the plurality of first LOGs, the plurality of third COF lines and the plurality of third PCB lines, and
    wherein the plurality of gate control signals and the plurality of data control signals are transmitted from the first PCB to the second PCB through the plurality of second PCB lines, the plurality of second COF lines, the plurality of second LOGs, the plurality of fourth COF lines and the plurality of fourth PCB lines.

3. The display device according to claim 1, wherein the first PCB further includes a power part configured to generate the plurality of powers and a timing controlling part configured to generate the image data, the plurality of gate control signals and the plurality of data control signals.

4. The display device according to claim 1, wherein the first and second PCBs and the display panel are connected through a plurality of COFs including the first and second COFs.

5. The display device according to claim 4, wherein each of the plurality of COFs includes a data driving part configured to generate a data signal using the image data and the plurality of data control signals, a plurality of fifth COF lines connected to one of the plurality of first PCB lines and the plurality of third PCB lines and configured to transmit the plurality of powers to the data driving part, and a plurality of sixth COF lines connected to one of the plurality of second PCB lines and the plurality of fourth PCB lines and configured to transmit the image data and the plurality of data control signals to the data driving part.

6. The display device according to claim 4, wherein at least one of the plurality of COFs includes a plurality of seventh COF lines connected to one of the plurality of first PCB lines and the plurality of third PCB lines and configured to transmit the plurality of powers and a plurality of eighth COF lines connected to one of the plurality of second PCB lines and the plurality of fourth PCB lines and configured to transmit the plurality of gate control signals.

7. The display device according to claim 6, wherein the display panel further includes a plurality of third LOGs connected to the plurality of seventh COF lines, a plurality of fourth LOGs connected to the plurality of eighth COF lines and at least one gate driving part connected to one of the plurality of third LOGs and the plurality of fourth LOGs.

8. The display device according to claim 1, wherein the plurality of first LOGs are directly and physically connected to the plurality of first COF lines and the plurality of third COF lines, and the plurality of second LOGs are directly and physically connected to the plurality of second COF lines and the plurality of fourth COF lines.

9. A display device, comprising:
a display panel including a line on glass (LOG), the LOG including a first LOG and a second LOG;
a first printed circuit board (PCB) including a first PCB line;
a second PCB including a second PCB line;
a first chip on film (COF) disposed between the first PCB and the display panel, and including a first COF line; and
a second COF disposed between the second PCB and the display panel, and including a second COF line;
wherein the LOG connects the first COF line and the second COF line that are respectively connected to the first PCB line and the second PCB line to one of transmit power from the first PCB to the second PCB or transmit a gate control signal or a data control signal from the first PCB to the second PCB,
wherein the display panel includes a display area for displaying an image and a non-display area surrounding the display area,
wherein a gate line and a data line cross each other to define a pixel region, a thin film transistor connected to the gate line and the data line and a pixel electrode connected to the thin film transistor are formed in the display area, and
wherein the first LOG and the second LOG include a same layer and a same material as one of a gate electrode, a source electrode and a drain electrode of the thin film transistor and the pixel electrode.

10. The display device according to claim 9, wherein the first PCB further includes a power part configured to generate the power and a timing controlling part configured to generate an image data, the gate control signal and the data control signal.

11. The display device according to claim 9, wherein the first and second PCBs and the display panel are connected through a plurality of COFs including the first and second COFs.

12. The display device according to claim 11, wherein each of the plurality of COFs includes a data driving part configured to generate a data signal using the image data and a plurality of data control signals including the data signal.

13. The display device according to claim 9, wherein the LOG directly and physically connects the first COF line and the second COF line that are respectively connected to the first PCB line and the second PCB line.

14. A display device, comprising:
a display panel including a line on glass (LOG);
a first printed circuit board (PCB) including a first PCB line;
a second PCB including a second PCB line;
a first chip on film (COF) disposed between the first PCB and the display panel, and including a first COF line; and
a second COF disposed between the second PCB and the display panel, and including a second COF line,
wherein the LOG transmits at least one of power and control signals between the first PCB and the second PCB,
wherein the LOG is connected to the first COF line and the second COF line, and
wherein the LOG is formed in the same layer and with the same material as one of a gate electrode, a source electrode and a drain electrode of a thin film transistor (TFT) and a pixel electrode of the display device.

15. The display device according to claim 14, wherein the LOG includes a plurality of LOGs transmitting the at least one of power and control signals between the first PCB and the second PCB.

16. The display device according to claim 14, wherein the first PCB includes a power part that provides the power, and a timing controller that provides the control signals.

17. The display device according to claim 16, wherein the LOG transmits the power and the control signals from the first PCB to the second PCB.

18. The display device according to claim 14, wherein the control signals include a gate control signal, a data control signal, and a timing control signal.

19. The display device according to claim 14, wherein the LOG is directly and physically connected to the first COF line and the second COF line.

* * * * *